United States Patent [19]
Chun

[11] Patent Number: 5,659,586
[45] Date of Patent: Aug. 19, 1997

[54] DIGITAL TIMING RECOVERY CIRCUIT INCLUDING A LOOP FILTER HAVING A VARYING BAND WIDTH

[75] Inventor: Ji-yong Chun, Seoul, Rep. of Korea

[73] Assignee: Samsung Electronics Co., Ltd., Kyungki-do, Rep. of Korea

[21] Appl. No.: 366,726

[22] Filed: Dec. 30, 1994

[30] Foreign Application Priority Data

Jun. 30, 1994 [KR] Rep. of Korea ............... 1994-15693

[51] Int. Cl.⁶ .................. H04L 7/00; H03D 3/24
[52] U.S. Cl. .................. 375/355; 375/376; 327/156
[58] Field of Search .................. 375/355, 362, 375/371, 373, 375, 376; 327/2, 5, 141, 144, 146, 147, 150, 155, 156, 159, 162, 163; 331/1 R, 18, 25; 348/500, 510, 516, 521, 536, 537; 358/320, 337

[56] References Cited

U.S. PATENT DOCUMENTS 5,235,622  8/1993  Yoshida ........................ 375/376
5,255,289 10/1993  Tomita ......................... 375/355
5,335,252  8/1994  Kobayashi ..................... 375/355
5,490,174  2/1996  Shin et al. .................... 375/355

*Primary Examiner*—Stephen Chin
*Assistant Examiner*—Hai H. Phan
*Attorney, Agent, or Firm*—Leydig, Voit & Mayer

[57] ABSTRACT

A digital timing recovery circuit for recovering a sampling clock of a playback signal in digital equipment, provides a fast phase obtaining time, reduces a phase error so as to generate a stable sampling clock and a dead zone effect caused by performing a quantization using a limited number of bits in hardware, and includes an analog-to-digital converter, a phase error detector, a phase error comparator, a loop filter, a reference voltage generator, a digital-to-analog converter and a variable voltage oscillator, to thereby reduce the phase obtaining time by varying the bandwidth of the loop filter according to the phase error size detected by the phase error detector and reduce a sampling phase error caused by noise at a constant state.

10 Claims, 5 Drawing Sheets

| SELECTION SIGNAL (S0,S1) | | | LSB | | | | | MSB |
|---|---|---|---|---|---|---|---|---|
| 0, 0 | 8 | 9 | 10 | 11 | 12 | 13 | 14 | S |
| 0, 1 | 7 | 8 | 9 | 10 | 11 | 12 | 13 | S |
| 1, 0 | 6 | 7 | 8 | 9 | 10 | 11 | 12 | S |
| 1, 1 | 5 | 6 | 7 | 8 | 9 | 10 | 11 | S |

VCO CONTROL SIGNAL

DIGITAL TIMING RECOVERY CIRCUIT INCLUDING A LOOP FILTER HAVING A VARYING BAND WIDTH

BACKGROUND OF THE INVENTION

The present invention relates to a digital timing recovery circuit of digital video equipment for recovering a sampling clock from an image playback signal, and more particularly, to a digital timing circuit for generating a stable sampling clock by means of varying the bandwidth of a loop filter.

In a conventional digital timing recovery circuit, the bandwidth of a loop filter is widened in order to curtail a phase obtaining time during the early stages of obtaining a sampling phase. Thus, the sampling phase changes greatly due to noise at a constant state, which causes a large phase error. In addition, upon hardware realization, a dead zone effect is produced by performing a quantization using a limited number of bits.

An accuracy of a bit clock extracted from a signal reproduced in a digital video equipment system affects on a general function of a reproducing system. Specifically, in a modern tendency for accomplishing a high density storing device, it is more important to precisely restore a bit clock since interference among recorded signals becomes serious. In general, a digital timing recovery circuit operates in a feedback structure, as follows. A phase error is detected from a sampled digital reproduction signal and a signal output via a digital filter is converted into an analog signal. Then, a variable voltage oscillator is adjusted and a reproduced signal is sampled with respect to the adjusted clock.

Every time a system skips when an initial operation is performed or in order to search a recorded program, there is a considerable difference between the phase of a sampling clock for sampling a reproduced signal and that of a bit clock of a reproduced signal. Therefore, a digital timing recovery circuit has to perform a phase obtaining operation. The phase obtaining operation mainly aims to record predetermined data and remove the difference between a sampling phase and a bit clock phase of a playback signal during a signal playback operation. Here, as the phase obtaining time becomes shorter, quantity of the required data can be reduced, thereby enhancing the recording density.

In general, a bit clock of a reproduced signal can be quickly traced by means of widening the bandwidth of a loop filter when a phase obtaining operation is performed in a digital timing recovery circuit. However, a phase error becomes large whenever phase obtaining is performed to an certain extent. Specifically, if a signal-to-noise ratio is low, a phase difference increases due to the noise, to thereby cause a great difference in a sampling clock. On the contrary, when the bandwidth of a loop filter becomes narrow in order to reduce a phase error, the sampling clock phase varies less at a state where a phase obtaining is completed to some extent. For this case, a problem exists in that a phase error obtaining time becomes longer.

Meanwhile, in consideration of hardware, data output from a loop filter has to be quantized to a limited number of bits so as to input the data to a digital-to-analog converter. However, the number of quantized bits has to accord with the number of bits required in the digital-to-analog converter. At this time, the number of the required bits is generally six to eight. Thus, quantization noise increases and a dead zone effect is produced. The dead zone effect is produced when a variable voltage oscillator control signal output from a loop filter is smaller than quantization step size $\Delta$. Here, a sampling phase control is no longer performed, despite a phase error detection. Since the quantization step size $\Delta$ becomes larger as the number of quantization bits of the variable voltage oscillator control signal becomes smaller, a "dead zone" effect is enlarged.

The present invention is a digital timing recovery circuit that reduces a phase obtaining time, a phase error at a constant state and a dead zone effect caused by limiting a quantization of bits.

SUMMARY OF THE INVENTION

Accordingly, it is an object of the present invention to provide a digital timing recovery apparatus for curtailing a phase obtaining time and reducing a phase error so as to generate a stable sampling clock.

It is another object of the present invention to provide a digital timing recovery apparatus for reducing, upon hardware realization, a dead zone effect which is produced by quantizing a limited number of bits.

To accomplish the above object of the present invention, there is provided a digital timing recovery circuit of digital video equipment for recovery a sampling clock from a low-frequency component of an analog video reproduction signal, the circuit comprising: digital-to-analog converting means for converting the analog low-frequency component signal into a digital signal; phase error detecting means for detecting a phase error between a sampling clock of the signal output from the analog-to-digital converting means and a reproduction signal bit clock; phase error comparing means for comparing the phase error value output from the phase error detecting means and a predetermined threshold value; a loop filter for selectively outputting the phase error output from the phase error detecting means, according to the output of the phase error comparing means; reference voltage generating means for generating a predetermined plurality of reference voltages and selectively outputting one of the generated plurality of reference voltage according to the output of the phase error comparing means; digital-to-analog converting means for converting a digital signal output from the loop filter into an analog signal, based on a signal generated from the reference voltage generating means as a reference voltage; and variable voltage generating means for receiving an analog signal from the digital-to-analog converting means, adjusting the frequency and phase of a clock, and generating a variable voltage so as to provide a sampling clock to the analog-to-digital converting means.

BRIEF DESCRIPTION OF THE DRAWINGS

The above objects and other advantages of the present invention will become more apparent by describing in detail a preferred embodiment thereof with reference to the attached drawings in which.

DETAILED DESCRIPTION OF THE INVENTION

The present invention will be explained in more detail with reference to the attached drawings.

Figure 1:
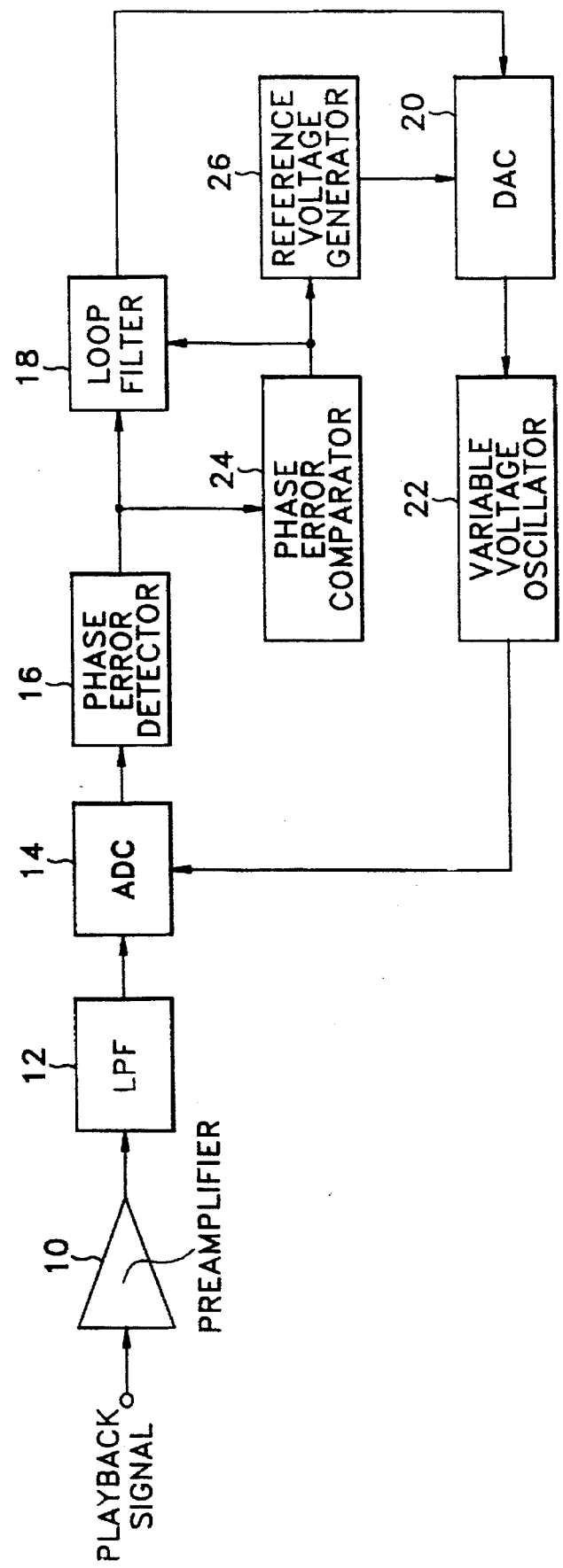
FIG. 1 is a block diagram of a digital timing recovery circuit of the present invention.

FIG. 1 is a block diagram of a digital timing recovery circuit of the present invention. Referring to FIG. 1, reference numeral 10 denotes a preamplifier, 12 denotes a low-pass filter (LPF), 14 denotes an analog-to-digital converter (ADC), 16 denotes a phase error detector, 18 denotes a loop filter, 20 denotes a digital-to-analog converter (DAC), 22 denotes a variable voltage oscillator, 24 denotes a phase error comparator and 26 denotes a reference voltage generator.

The following three items are assumed in order to explain FIG. 1. First, phase error in phase error comparator 24 is divided into four sizes. Second, an output signal of loop filter 18 is limited into an 8-bit signal. Third, a signal before the limitation is a 16-bit signal. Though these three items are assumed for the conveniences of explanation, the present invention is not necessarily so restricted, and various changes and modifications may be made in the invention without departing from the spirit and scope thereof.

Referring to FIG. 1, a playback analog signal passes through preamplifier 10 and LPF 12 and is converted into a digital signal in ADC 14 and input to phase error detector 16. Phase error detector 16 detects, from the input signal, a phase error between a sampling clock and a reproduction signal bit clock and sends the result to loop filter 18. Loop filter 18 filters the signal and outputs the result to DAC 20 which converts the signal into an analog signal, to thereby control the frequency and phase of a clock generated in variable voltage oscillator 22. The controlled clock is input to ADC 14 and the playback signal is sampled by the controlled frequency and phase. Phase error comparator 24 compares the amplitude of an output signal of phase error detector 16 with a predetermined threshold value and outputs the result to loop filter 18 and reference voltage generator 26.

Figure 2:
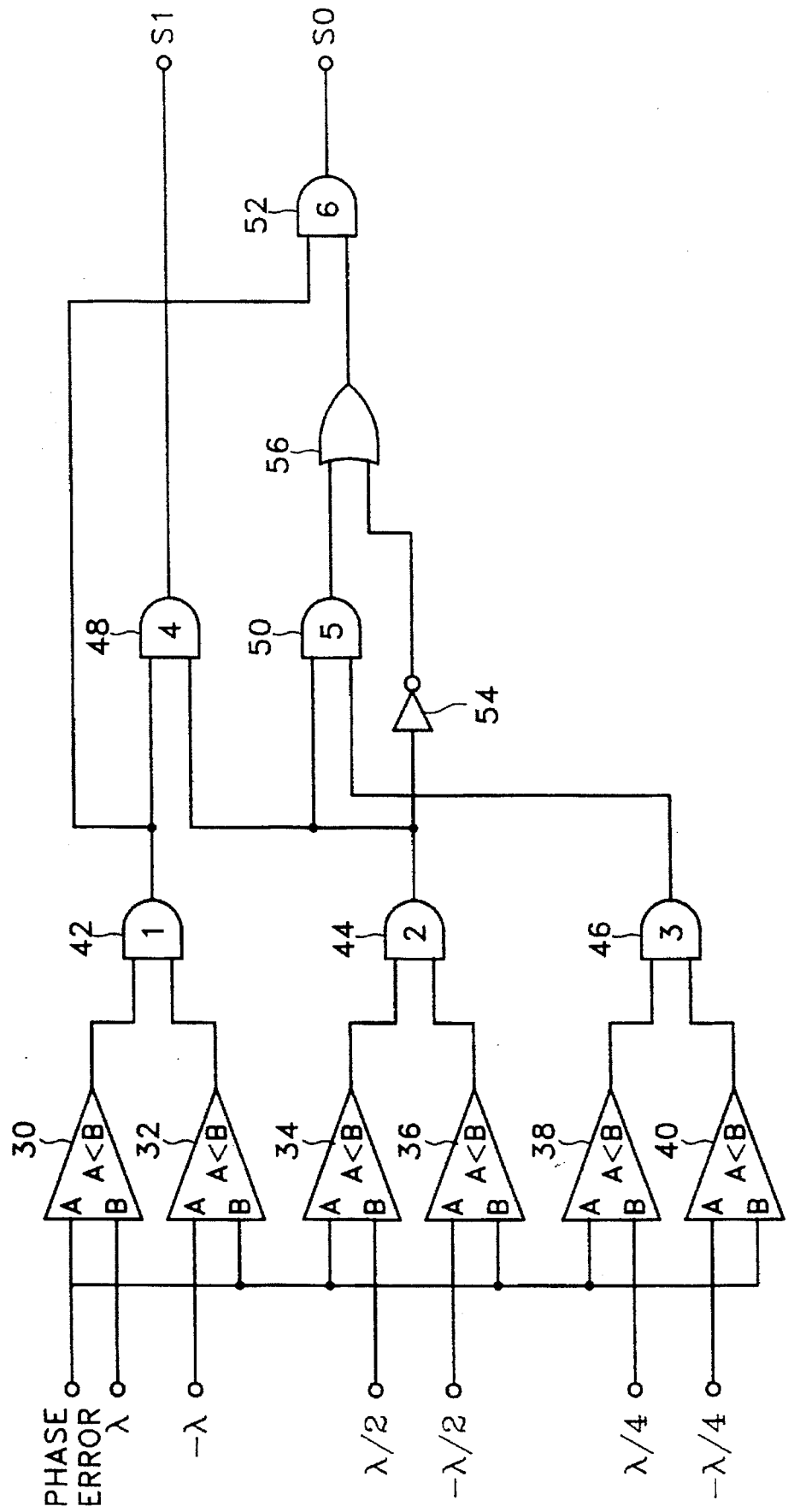
FIG. 2 illustrates an embodiment of the phase error comparator shown in FIG. 1.

FIG. 2 illustrates an embodiment of the phase error comparator shown in FIG. 1. Referring to FIG. 2, reference numerals 30 to 40 denote first to sixth comparators, respectively, 42 to 52 denote first to sixth AND gates, respectively, 54 denotes an inverter, and 56 denotes an OR gate.

Referring to FIG. 2, a signal output from phase error detector 16 is a two's complement and input to first to sixth comparators. First to sixth comparators compare the amplitude of the input signal at port A with that at port B, and output the logical value "1" if the A signal is smaller than the B signal, and a logical value "0" otherwise. First comparator 30 is for comparing signal amplitude with respect to a predetermined threshold value $\lambda$ at input B, and second comparator 32 is for comparing signal amplitude with respect to a predetermined threshold value $-\lambda$ at input A. The output signals of first and second comparators 30 and 32 are the input signals of first AND gate 42. Third comparator 34 is for comparing signal amplitude with respect to a predetermined threshold value $\lambda/2$ at input B, and fourth comparator 36 is for comparing a signal amplitude with respect to a predetermined threshold value $-\lambda/2$ at input A. The output signals of third and fourth comparators 34 and 36 are the input signals of second AND gate 44. Fifth comparator 38 is for comparing signal amplitude with respect to a predetermined threshold value $\lambda/4$ at input B, and sixth comparator 40 is for comparing signal amplitude with respect to a predetermined threshold value $-\lambda/4$ at input A. The output signals of first and sixth comparators 38 and 40 are the input signal of third AND gate 46. Fourth AND gate 48 receives output signals of first and second AND gates 42 and 44 and outputs signal S1. In a similar way, sixth AND gate 52 receives output signals of first to three AND gates 42, 44 and 46, fifth AND gate 50, inverter 54 and logical sum gate 56, and outputs signal S0. If output signals of first, second and third AND gates 42, 44 and 46 are assumed as a, b and c, respectively, the Boolean relationship among output signals of phase error comparator 24 can be shown as follows.

$S0 = a(\bar{b} + bc)$ $S1 = ab$

The relationship between output signals S0 and S1 of phase error comparator 24 and output signals of phase error detector 16 can be shown in the following table.

| comparison between x and threshold value | output signals (S1, S0) |
| --- | --- |
| $x \geq \lambda$ or $x \leq -\lambda$ | (0, 0) |
| $\lambda/2 \leq x < \lambda$ or $-\lambda \leq x \leq -\lambda/2$ | (0, 1) |
| $\lambda/4 \leq x < \lambda/2$ or $-\lambda/2 \leq x \leq -\lambda$ | (1, 0) |
| $-\lambda/4 \leq x \leq \lambda/4$ | (1, 1) |

Figure 3:
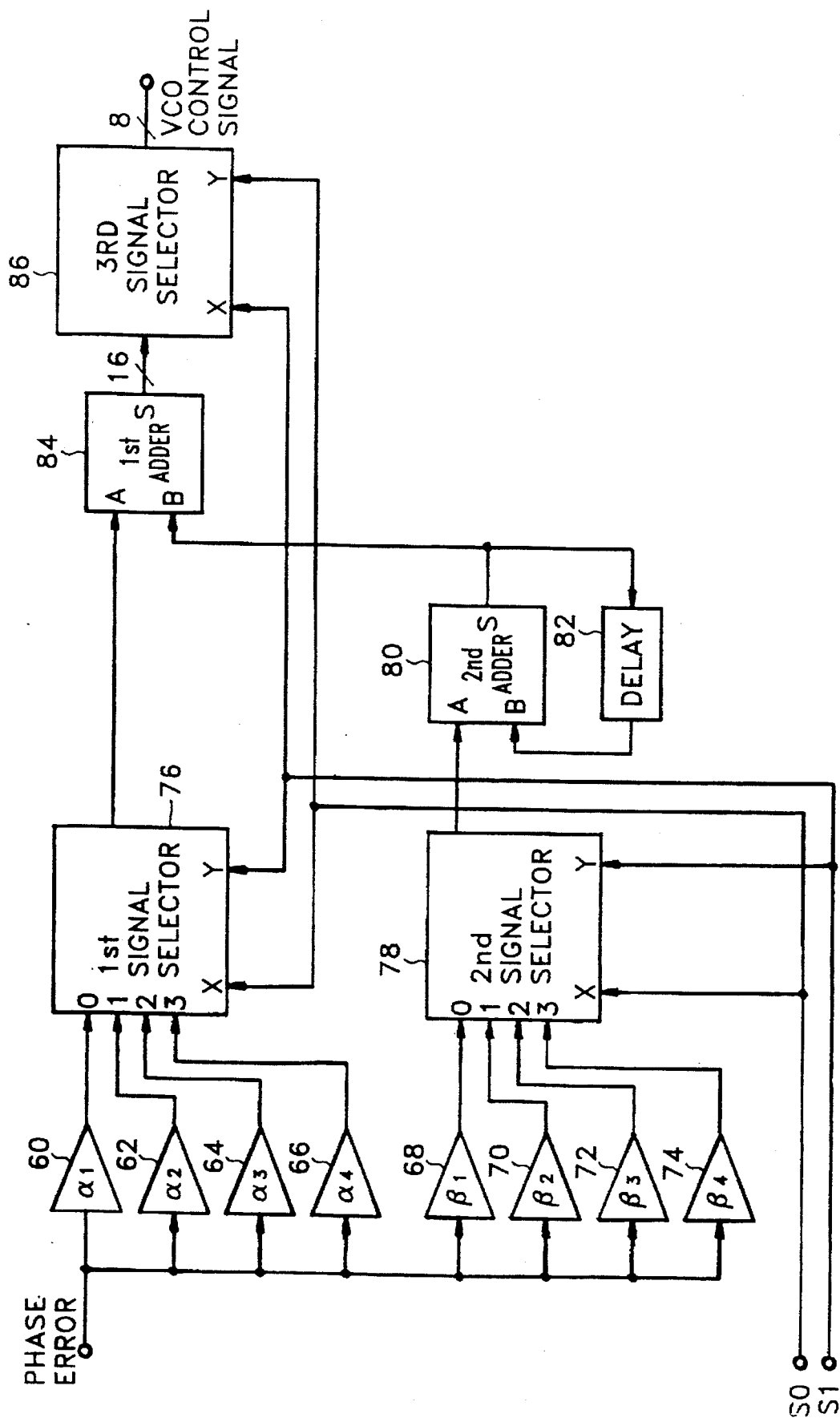
FIG. 3 illustrates an embodiment of the loop filter shown in FIG. 1.

Here, x is an output signal of a phase error detector 16 and S0 and S1 are output signals of a phase error comparator FIG. 3 illustrates an embodiment of a loop filter. Referring to FIG. 3, reference numerals 60 to 74 denote first to eighth multipliers, respectively, 76 and 78 denote first and second signal selectors, respectively, 80 denotes a second adder, 82 denotes a delay, 84 denotes a first adder, and 86 denotes a third signal selector.

A signal output from phase error detector 16 is input to first to fourth multipliers 60 to 66. Then, the results are respectively multiplied by $\alpha 1$ to $\alpha 4$ and input to first signal selector 76. In addition, an output signal of phase detector 16 is input to each of fifth to eighth multipliers 68 to 74. Then, the results are respectively multiplied by $\beta 1$ to $\beta 4$ and input to second signal selector 78. Here, relative amplitudes of 60 1 to $\alpha 4$ and $\beta 1$ to $\beta 4$ can be shown as follows.

$\alpha 1 > \alpha 2 > \alpha 3 > \alpha 4$ $\beta 1 > \beta 2 > \beta 3 > \beta 4$ First and second selectors 76 and 78 each selectively output one among four input signals according to values of output signals S0 and S1 of phase error comparator 24 which are output to selection terminals X and Y, respectively. Second adder 80 adds a signal output from delay 82 to a signal output from second signal selector 78. Delay 82 delays a signal output from second adder 80, and constitutes a feedback path. First adder 84 adds a signal output from second adder 80 to a signal output from first signal selector 76. An output of first adder 84 is 16-bit signal and input to third signal selector 86. The operation of third signal selector 86 can be explained with reference to FIG. 4A and FIG. 4B.

Figures 4A, 4B:
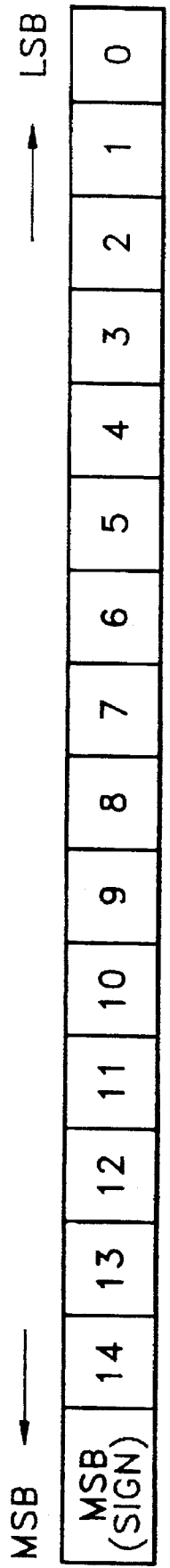
FIG. 4A illustrates a form of a 16-bit signal input to the third signal selector shown in FIG. 3.
FIG. 4B illustrates the output of a voltage-controlled oscillator control signal by means of selecting eight among sixteen bits by using the third signal selector according to S0 and S1 signals which are output from the phase error comparator.

FIG. 4A illustrates a form of an 16-bit signal input to third signal selector 86. The most significant bit is a sign bit since the 16-bit signal is a two's complement, and the remaining fifteen bits represent signal amplitude. FIG. 4B illustrates outputting a voltage-controlled oscillator (VCO) control signal by means of selecting eight among sixteen bits by using third signal selector 86 according to S0 and S1 signals which are output from the phase error comparator.

Figure 5B:
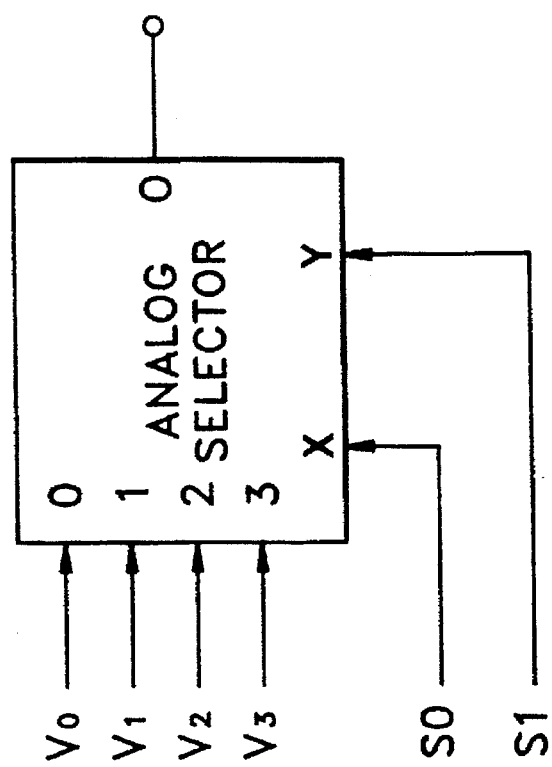
FIG. 5B illustrates an analog selector of the reference voltage generator shown in FIG. 1.
Figure 5A:
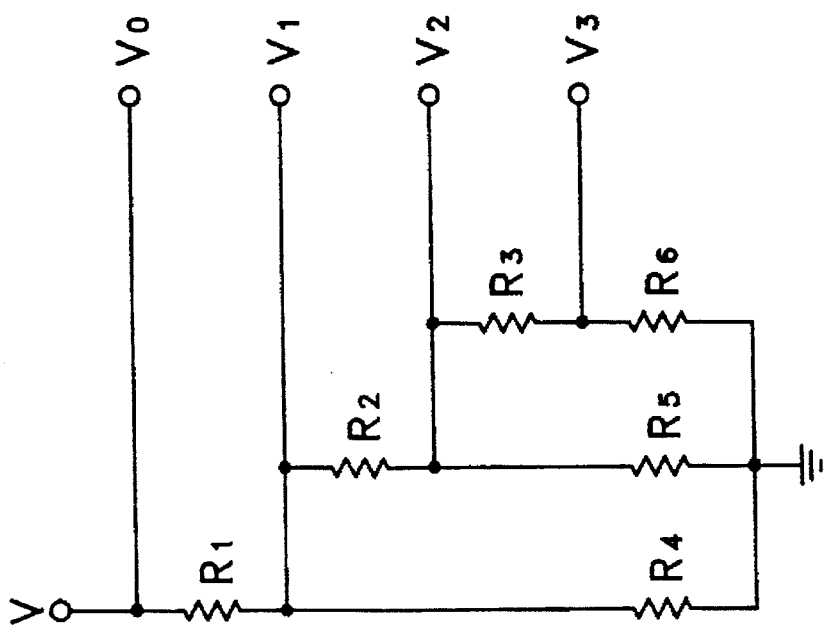
FIG. 5A illustrates a process of producing voltage signals V0, V1, V2 and V3 by means of dividing a reference voltage V within the reference voltage generator shown in FIG. 1.

FIG. 5A and FIG. 5B illustrate an embodiment of reference voltage generator 26 of FIG. 1. FIG. 5A illustrates a process of producing voltage signals V0, V1, V2 and V3 by means of dividing a reference voltage V. The process is performed by resistance values R1 to R6. The relationship of voltages V1 to V3 is as follows.

$$V0=V$$

$$V1=V/2$$

$$V2=V/4$$

$$V3=V/8$$

FIG. 5B illustrates an analog selector that selects one among the four voltage signals V0 to V3 according to S0 and S1, i.e., the output signal of phase error comparator 24, and inputs the result to DAC 20 as a reference voltage in digital-to-analog conversion.

DAC 20 receives a reference voltage of reference voltage generator 26, converts a VCO control signal of loop filter 18 to a digital-to-analog signal and provides the result to variable voltage oscillator 22. Variable voltage oscillator 22 receives the analog-converted signal, controls the frequency and phase of a clock and generates a variable voltage, to thereby generate a sampling clock which is synchronized with a playback clock of ADC 14.

As described above, a digital timing recovery circuit of the present invention varies the bandwidth of a loop filter according to a phase error size detected from a phase error detector, thereby reducing a phase obtaining time and a sampling phase error caused by noise at a constant state. In addition, a dead zone effect caused by performing a quantization using a limited number of bits upon hardware realization can be considerably reduced.

What is claimed is:

1. A digital timing recovery circuit of digital video equipment for recovery of a sampling clock from a low-frequency component of an analog video reproduction signal, said circuit comprising:

analog-to-digital converting means for converting an analog low-frequency component signal into a digital signal;

phase error detecting means for determining a phase error value between a sampling clock of the digital signal and a reproduction signal bit clock;

phase error comparing means for comparing the phase error value output from said phase error detecting means with a threshold value;

a loop filter for selectively outputting the phase error value output from said phase error detecting means, according to an output of said phase error comparing means;

reference voltage generating means for generating a plurality of reference voltages and selectively outputting one of the plurality of reference voltages according to the output of said phase error comparing means;

digital-to-analog converting means for converting a digital signal output from said loop filter into an analog signal using the one of the plurality of reference voltages output from said reference voltage generating means; and variable voltage generating means for receiving an analog signal from said digital-to-analog converting means, adjusting a frequency and a phase of a clock, and generating a variable voltage so as to provide sampling clock to said analog-to-digital converting means.

2. The digital timing recovery circuit according to claim 1 wherein said phase error comparing means comprises first to sixth comparators, the phase error value output from said phase error detecting means is x, and the threshold value is $\lambda$, said first to sixth comparators respectively comparing the phase error value output from said phase error detecting means with threshold values of $\lambda$, $-\lambda$, $\lambda/2$, $-\lambda/2$, $\lambda/4$, and $-\lambda/4$, and outputting a result as first and second output signals, thereby comparing the phase error value output from said phase error detecting means with the threshold values.

3. The digital timing recovery circuit according to claim 2 wherein said phase error comparing means includes judging means for determining whether $-\lambda<x<\lambda$, and which comprises first and second comparing means for respectively determining whether $x<\lambda$, and $x>-\lambda$, and an AND gate having results of said first and second comparing means as an input.

4. The digital timing recovery circuit according to claim 2 wherein said phase error comparing means includes judging means for determining whether $-\lambda/2<x<\lambda/2$, and which comprises first and second comparing means for respectively determining whether $x<\lambda/2$, and $x>-\lambda/2$, and an AND gate having results of said first and second comparing means as an input.

5. The digital timing recovery circuit according to claim 2 wherein said phase error comparing means includes judging means for determining whether $-\lambda/4<x<\lambda/4$, and which comprises first and second comparing means for respectively determining whether $x<\lambda/4$, and $x>-\lambda/4$, and an AND gate having results of said first and second comparing means as an input.

6. The digital timing recovery circuit according to claim 1 wherein said loop filter comprises:

first to eighth multipliers for multiplying a phase error value output from said phase error detecting means by a multiplication factor;

a first signal selector for receiving output signals of said first to fourth multipliers and selectively outputting a first result according to an output of said phase error comparing means;

a second signal selector for receiving output signals of said fifth to eighth multipliers and selectively outputting a second result according to an output of said phase error comparing means;

a second adder for adding an output signal of said second signal selector and a signal delayed by a predetermined time from an output signal of the second adder;

a first adder for adding an output signal of said first signal selector and an output signal of said second adder; and a third signal selector for selectively outputting an output signal of said first adder according to an output of said phase error comparing means.

7. The digital timing recovery circuit according to claim 6 wherein said first to fourth multipliers respectively include multiplication factors of $\alpha 1$, $\alpha 2$, $\alpha 3$, and $\alpha 4$, the relationship among the multiplication factors can be and $\alpha 1>\alpha 2>\alpha 3>\alpha 4$, and said fifth to eighth multipliers respectively include multiplication factors of $\beta 1$, $\beta 2$, $\beta 3$, and $\beta 4$ and $\beta 1 > \beta 2 > \beta 3 > \beta 4$.

8. The digital timing recovery circuit according to claim 6 wherein a signal output from said first adder includes sixteen bits and a most significant bit among the sixteen bits is a sign bit and the remaining fifteen bits represent signal amplitude, and said third signal selector outputs the sign bit and the next seven bits by employing first and second output signals output from said phase error comparing means as a signal selecting terminal.

9. The digital timing recovery circuit according to claim 8 wherein said third signal selector outputs sequential 7-bit signals of the sixteen bits by employing first and second output signals S0 and S1 as a signal selecting terminal, such that seven bits from 14th to 8th bits are output if (S0,S1) is (0,0), seven bits from the 13th to 7th bits are output if (S0,S1) is (0,1), next seven bits from the 12th to 6th bits are output if (S0,S1) is (1,0), and the next seven bits from the 11th to 5th bits are output if (S0,S1) is (1,1).

10. The digital timing recovery circuit according to claim 1 wherein said reference voltage generating means generates four reference voltages by employing a predetermined number of resistance devices and selectively outputs the result according to an output of said phase error comparing means.

* * * * *

UNITED STATES PATENT AND TRADEMARK OFFICE
CERTIFICATE OF CORRECTION

PATENT NO.   : 5,659,586
DATED        : August 19, 1997
INVENTOR(S)  : Chun

It is certified that error appears in the above-indentified patent and that said Letters Patent is hereby corrected as shown below:

Column 6, Line 7, after "provide" insert --a--;

Line 65, change "60 4" to --α4--.

Signed and Sealed this

Sixth Day of January, 1998

Attest:

BRUCE LEHMAN

Attesting Officer

Commissioner of Patents and Trademarks